United States Patent [19]

Shibahara et al.

[11] 3,903,480

[45] Sept. 2, 1975

[54] AUTOMATIC GAIN CONTROL CIRCUIT

[75] Inventors: Kenji Shibahara; Yukio Onoe, both of Tokyo, Japan

[73] Assignee: Sony Corporation, Tokyo, Japan

[22] Filed: June 17, 1974

[21] Appl. No.: 479,802

[30] Foreign Application Priority Data

June 18, 1973 Japan ................................ 48-71912
June 18, 1973 Japan ................................ 48-71913
June 18, 1973 Japan ................................ 48-71914

[52] U.S. Cl. .................. 330/28; 325/378; 325/475; 330/149

[51] Int. Cl.[2] ............................................ H03F 1/34

[58] Field of Search ........ 330/149, 26, 28; 325/473, 325/474, 475, 476, 472, 378; 307/237

*Primary Examiner*—John Kominski
*Attorney, Agent, or Firm*—Hill, Gross, Simpson, Van Santen, Steadman, Chiara & Simpson

[57] ABSTRACT

An automatic gain control circuit is disclosed in which the emitter electrode of a transistor for amplification is grounded through the collector-emitter path of a transistor for control, the collector electrode of the first mentioned transistor is connected to a voltage source through a series connection of a tuning circuit and a resistor, and the connection point between the tuning circuit and resistor is grounded through a capacitor, and in which the connection point between the tuning circuit and resistor is connected through a series connection of resistor and a capacitor to the base electrode of the second mentioned transistor and a detected signal is applied to a low-pass filter to produce an AGC voltage which is applied to the base electrode of the second mentioned transistor.

3 Claims, 9 Drawing Figures

AUTOMATIC GAIN CONTROL CIRCUIT

BACKGROUND OF THE INVENTION

1. Field of the Invention

This invention relates generally to an automatic gain control circuit (which will be hereinafter referred to as an AGC circuit), and more particularly to an AGC circuit which is simple in construction, but rapid in rising-up, good in characteristic and free from distortion, 2. Description of the Prior Art A prior art AGC circuit or forward AGC circuit is shown in FIG. 1. In FIG. 1, reference numeral 1 is a transistor for a mixer of a frequency converting circuit. The base electrode of the transistor 1 is connected to an input terminal 2 to which a received signal and a local oscillating signal are applied, the collector electrode of the transistor 1 is connected through a tuning circuit 6 consisting of a primary winding 4 of an intermediate frequency transformer 3 and a capacitor 5 and through a resistor 7 to a voltage source terminal 8 of $+V_{cc}$. A connection point 10 between the tuning circuit 6 and the resistor 7 is grounded through a bypass capacitor 9. The emitter electrode of the transistor 1 is grounded through the collector-emitter path of a control transistor 11, a resistor 12 and a capacitor 13, respectively. In the figure, reference numeral 15 indicates the last stage transistor in the intermediate frequency amplifier circuit. The intermediate frequency signal therefrom is applied through an intermediate transformer 16 to a diode 17 the detected output signal by which is delivered to an output terminal 18. The detected output signal from the diode 17 is also applied to a low-pass filter 23 consisting of a resistor 21 and a capacitor 22 in which an AGC voltage is produced. The AGC voltage is applied to the base electrode of the transistor 11.

With such a prior art AGC circuit shown in FIG. 1, when an input level at the terminal 2 increases, the detected output signal from the diode 17 is intended to be increased in level. However, since at this time the level of the AGC voltage from the low-pass filter 23 also increases, the impedance of the transistor 11 becomes small to increase its collector current and hence the voltage drop across the resistor 7 increases. As a result, the gain of the transistor 1 becomes low or a forward AGC is applied to the transistor 1 and hence the signal level at the terminal 18 is made constant regardless of the input level.

The forward AGC is wide in control range as compared with a reverse AGC, but there is a defect that distortion characteristic, especially the distortion characteristic for a great input of the former is deteriorated as compared with the latter. That is, the low-pass filter 23 passes therethrough a DC component contained in the detect output signal from the diode 17 and applies the DC component to the transistor 11 as the AGC voltage. In this case, however, a low frequency component of a sound signal in a detect output signal is also applied to the transistor 11 through the low-pass filter 23, so that the low frequency component is applied to the emitter electrode of the transistor 1. As a result, the intermediate frequency signal is modulated with the low frequency component in the transistor 1. This causes a distortion which may be appeared in the detected output signal at the terminal 18.

In order to prevent the generation of such a distortion, it may be enough to make low the cut-off frequency of the low-pass filter 23, but the lowering of the cut-off frequency of the low-pass filter 23 makes its time constant long and hence deteriorates the rising-up of the AGC. Accordingly, the circuit can not follow up the rapid or sharp change of the input level.

SUMMARY OF THE INVENTION

According to this invention, there is proposed an AGC circuit in which the emitter electrode of a transistor for amplification is grounded through the collector-emitter path of a transistor for control, the collector electrode of the first mentioned transistor is connected to a voltage source through a series connection of a tuning circuit and a resistor, and the connection point between the tuning circuit and resistor is grounded through a capacitor, and in which the connection point between the tuning circuit and resistor is connected through a series connection of resistor and a capacitor to the base electrode of the second mentioned transistor and a detected signal is applied to a low-pass filter to produce an AGC voltage which is applied to the base electrode of the second mentioned transistor.

Accordingly, it is an object of this invention to provide an AGC circuit which prevents the generation of distortion or improves distortion characteristics with simple construction.

It is another object of this invention to provide an AGC circuit with which the rising-up of an AGC voltage is rapid.

It is a further object of this invention to provide an AGC circuit wide in AGC control range and good in S/N ratio.

The other objects, features and advantages of this invention will become apparent from the following description taken in conjunction with the accompanying drawing.

DESCRIPTION OF THE PREFERRED EMBODIMENTS

Embodiments of the AGC circuit according to this invention will be hereinafter described.

Figure 1:
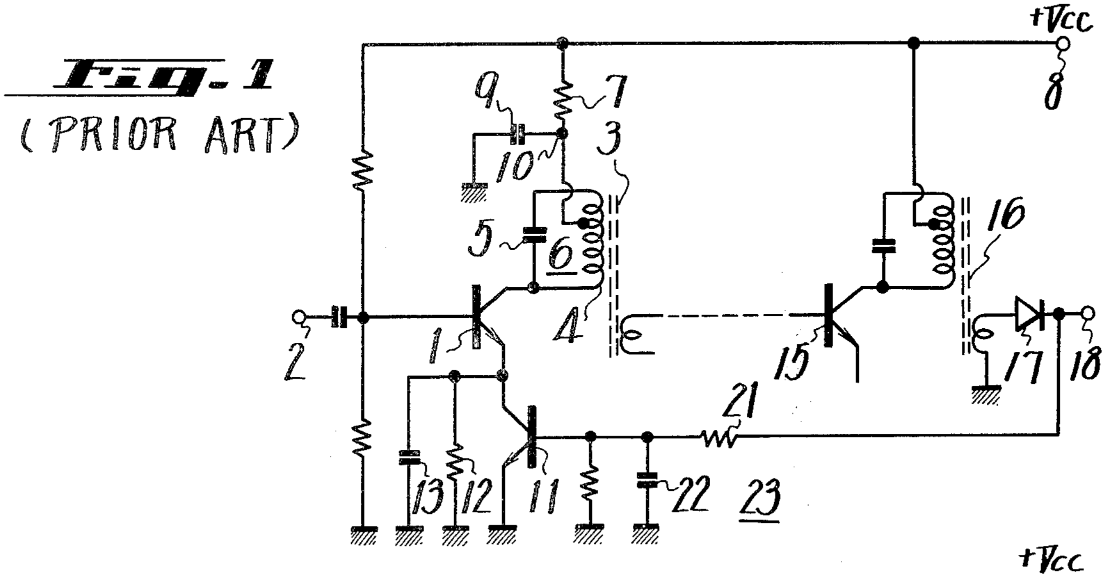
Fig. 1 (PRIOR ART)
FIG. 1 is a connection diagram showing a prior art AGC circuit.
Figure 2:
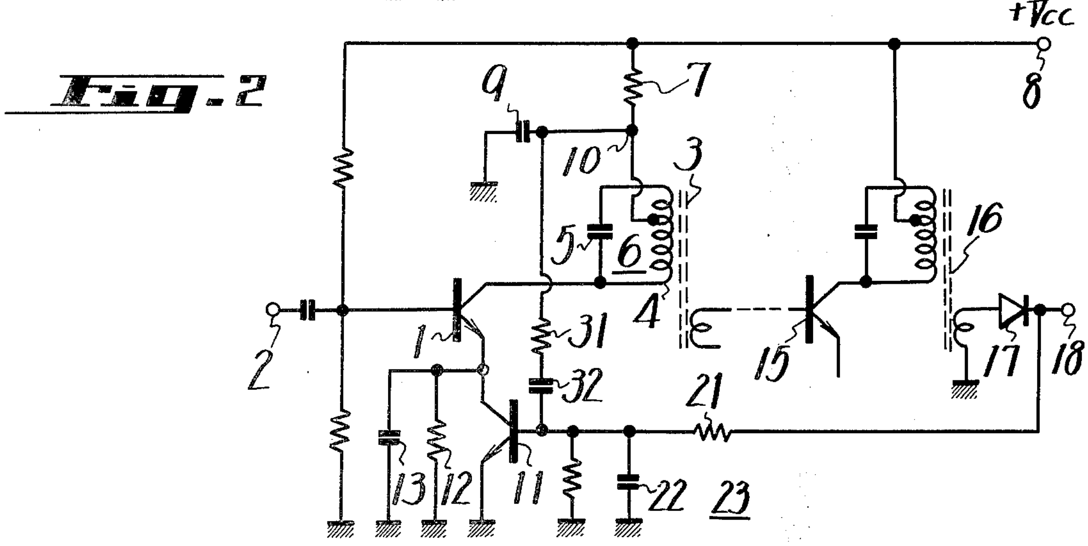
FIG. 2 is a connection diagram showing a first embodiment of the AGC circuit according to this invention.

FIG. 2 is a connection diagram showing an embodiment of the AGC circuit according to the invention in which reference numerals same as those used in FIG. 1 represent the same elements and their construction and operation are approximately same, so that no description will be given thereon in detail.

In the embodiment of the invention shown in FIG. 2, the connection point 10 between the tuning circuit 6 and the resistor 7 is connected through a series connection of a resistor 31 and a capacitor 32 to the base electrode of the transistor 11. The other circuit construction of this embodiment is substantially same as that of the prior art embodiment shown in FIG. 1.

With the embodiment of the invention described above, the impedance of the primary coil 4 of the transformer 3 is sufficiently low viewed from the low frequency component derived from the low-pass filter 23, so that the resistor 7 becomes a load for the low frequency component. Thus, the intermediate frequency signal is modulated with the low frequency component in the transistor 1 and at the same time the low frequency component is delivered to the connection point 10. The low frequency component delivered to the connection point 10 is then applied through the series connection of the resistor 31 and capacitor 32 to the base electrode of the transistor 11. In this case, the low frequency component appeared at the connection point 10 is such a signal that the low frequency component from the low-pass filter 23 is reversed in phase by the transistor 11. Thus, when the low frequency component is applied to the base electrode of the transistor 11 from the connection point 10, the low frequency component applied to the base electrode of the transistor 11 from the low-pass filter 23 directly is cancelled with that applied from the connection point 10. Accordingly, the intermediate frequency signal from the transistor 1 is not modulated with the low frequency component, so that any distortion is not produced or the distortion characteristic is improved.

As mentioned above, with the embodiment of the invention shown in FIG. 2, the generation of distortion in the forward AGC circuit is avoided with only the provision of the series circuit of the resistor 31 and capacitor 32, which is simple in construction and cheap.

A second embodiment of the AGC circuit according to the invention will be now described with reference to FIG. 3 in which the same reference numerals as those used in FIG. 2 represent the same elements and hence their description will be omitted for the sake of brevity.

Figure 3:
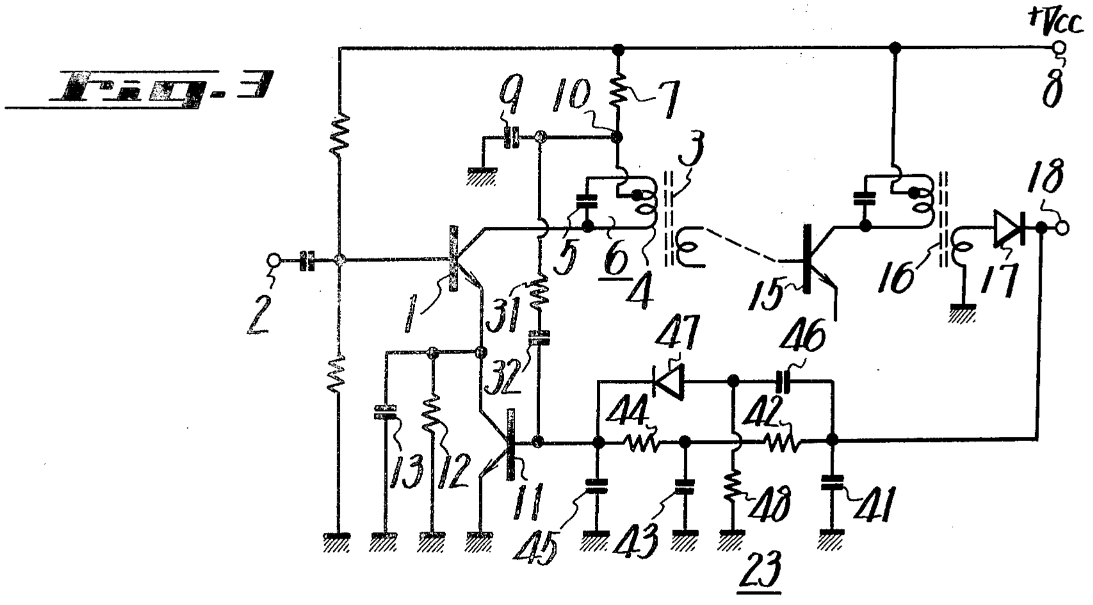
FIG. 3 is a connection diagram showing a second embodiment of the AGC circuit of this invention.

The difference between the embodiments shown in FIGS. 2 and 3 resides in the construction of the low-pass filter 23 connected between the output side of the diode 17 and the base electrode of the transistor 11 and so on. That is, the output side of the diode 17 is grounded through a capacitor 41, a series circuit of a resistor 42 and a capacitor 43 is connected in parallel to the capacitor 41, a series circuit of a resistor 44 and a capacitor 45 is connected in parallel to the capacitor 43, and the connection point between the resistor 44 and the capacitor 45 is connected to the base electrode of the transistor 11. The capacitors 41, 43, 45 and the resistors 42, 44 form the above mentioned low-pass filter 23. In order to make the rising-up of the AGC voltage rapid, in this embodiment a series circuit of a capacitor 46 and a diode 47 is connected between the output side of the diode 17 and the base electrode of the transistor 11, and the connection point between the capacitor 46 and the diode 47 is grounded through a resistor 48. By way of example, the resistance values of the resistors 42, 44, 48 are selected 4.7KΩ, 56KΩ, 27KΩ, respectively, and the capacitance values of the capacitors 43, 45, 46 are selected 2.2μF, 0.022 μF, 22μF, respectively. The other circuit construction of the embodiment shown in FIG. 3 is substantially same as that of the embodiment shown in FIG. 2.

Figures 4A, 4B, 4C, 4D:
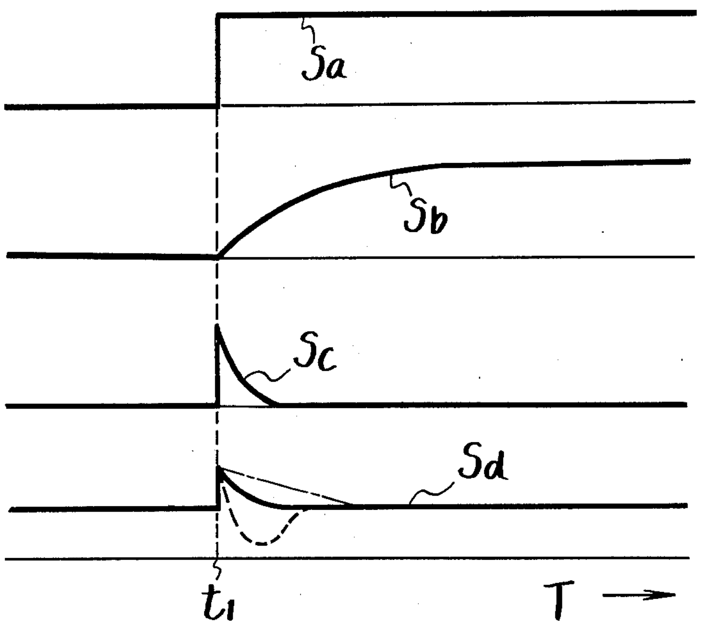
FIGS. 4A to 4D, inclusive, are waveform diagrams used for explaining the second embodiment of this invention shown in FIG. 3.

With the embodiment of FIG. 3, if the elements 31, 32, 46, 47 and 48 are not employed, the circuit may operate as an ordinary forward AGC circuit as described previously. That is, when the input level at the terminal 2 increases at a time $t_1$, the detected signal $S_a$ from the diode 17 is intended to be increased in level, as shown in FIG. 4A. However, at this time, as shown in FIG. 4B, the AGC voltage $S_b$ from the low-pass filter 23 is also increased, so that the impedance of the transistor 11 becomes small with the result that the collector current of the transistor 1 increases and hence the voltage drop across the resistor 7 increases. Accordingly, the gain of the transistor 1 becomes low, or the forward AGC is applied to the transistor 1 and hence the signal level at the terminal 18 becomes constant regardless of the input level (In this case, however, since the time constant of the low-pass filter 23 is great, the rising-up of the AGC voltage $S_b$ is slow as described previously. Accordingly, as shown in FIG. 4D by a chain line, the detected signal $S_d$ at the terminal 18 arrives at a reference level gradually).

However, with the embodiment shown in FIG. 3, since the elements 31, 32, 46, 47 and 48 are provided in the manner mentioned as above, when the input level increases at the time $t_1$, the DC level of the detected signal at the terminal 18 increases at that instance. Accordingly, the DC level of the detected signal exceeds the on-level of the diode 47 at this time to make the same conductive. Thus, as shown in FIG. 4C, the DC voltage $S_c$ in the detected signal is applied to the base electrode of the transistor 11 with charging up the capacitor 46, so that the AGC is carried out immediately at the time $t_1$ to lower the level of the detected signal $S_d$ very rapidly, as shown in FIG. 4D by a dotted line. In this case, since the voltage $S_c$ is applied through the capacitor 46, the voltage $S_c$ is lowered when the capacitor 46 is charged up. However, at this time the voltage $S_b$ substantially finished its rising up, so that thereafter the AGC is applied by the voltage $S_b$ and the detected signal $S_d$ becomes in level to the reference level.

When the input level increases rapidly, the level of the detected signal $S_d$ becomes lower than the reference level once, as shown in FIG. 4D by the dotted line. However, since the series connection of the resistor 31 and capacitor 32 is provided, when the input level increases rapidly, an AC load of the transistor 1 for the rising up variation becomes the parallel circuit of the tuning circuit 6 and the resistor 31. As a result, even if the input level increases rapidly at the time $t_1$ and the voltage across the collector-emitter of the transistor 1 is intended to be small by the signal $S_c$, due to the fact that the AC load of the transistor 1 becomes small, the voltage across its collector-emitter is not lowered so much. Hence, the level of the detected signal $S_d$ is not lowered beyond the reference level as shown in FIG. 4D by the solid line and arrives to the reference level in short time period from the time $t_1$ smoothly.

As described above, with the embodiment shown in FIG. 3, since the series circuit of the diode 47 and the capacitor 46 is connected to the low-pass filter 23, the rising-up of the AGC is made rapid. Further, due to the provision of the series circuit of the resistor 31 and the capacitor 32, the rising-up characteristic of the AGC is made smooth.

As mentioned previously, if the cut-off frequency of the low-pass filter 23 is high, the low frequency component of the sound signal contained in the detected signal $S_a$ is applied to the base electrode of the transistor 11 through the low-pass filter 23 and hence the low frequency component is applied to the emitter electrode of the transistor 1. For this reason, the intermediate frequency signal is modulated with the low frequency component in the transistor 1 with the result that a distortion appears in the detected signal at the terminal 18. However, since the impedance of the primary winding 4 of the transformer 3 is sufficiently small for the low frequency component, the resistor 7 becomes a load for the low frequency component and hence the low frequency component appears at the connection point 10 between the resistor 7 and the tuning circuit 6. In this case, since the series circuit of the resistor 31 and the capacitor 32 is provided, the low frequency component appeared at the connection point 10 is applied to the base electrode of the transistor 11 through the series circuit of the resistor 31 and the capacitor 32. The low frequency component appeared at the connection point 10 is reversed by the transistor 11 in phase with respect that from the low-pass filter 23, so that the low frequency component from the low-pass filter 23 is cancelled by that from the connection point 10 at the base electrode of the transistor 11 as in the case of the embodiment shown in FIG. 2. As a result, the intermediate frequency signal from the transistor 1 is not modulated with the low frequency component and no distortion is generated to improve the distortion characteristic.

Further, with the embodiment shown in FIG. 3, even if the low frequency component of the sound signal is contained in the AGC voltage $S_b$ from the low-pass filter 23, the distortion characteristic is good. Therefore, the time constant of the low-pass filter 23 can be shortened, so that the rising-up of the AGC can be made rapid so much.

A third embodiment of the invention will be now described with reference to FIG. 5. In the figure, reference numeral 101 designates a transistor for a mixer in a frequency converting stage. The base electrode of the transistor 101 is connected to an terminal 102 which is supplied with a received signal and a local oscillation signal, its collector electrode is connected through a series connection of a primary winding 103*a* of an intermediate frequency signal transformer 103 and a resistor 104 to a voltage source terminal 105 of $+V_{cc}$, and its emitter electrode is grounded through the collector-emitter path of a control transistor 107 for an AGC and also grounded through a parallel connection of a resistor 108 and a capacitor 109. The connection point 110 between the primary winding 103*a* and the resistor 104 is grounded through a capacitor 106. The base electrode of a transistor 111 for intermediate frequency signal amplification is connected to the emitter electrode of the transistor 101 through a series connection of a secondary winding 112b of an intermediate frequency signal transformer 112 and a resistor 113. A ceramic filter 114 is inserted between a secondary winding 103*b* of the transformer 103 and a primary winding 112*a* of the transformer 112. The collector electrode of the transistor 111 is connected through a resistor 115 to the terminal 105 and its emitter electrode is grounded through a parallel connection of a resistor 116 and a capacitor 117. Thus, the intermediate frequency signal from the transistor 101 is applied through the transformer 103 to filter 114 to transformer 112 to the transistor 111 and then applied through a transistor 121 to an intermediate frequency signal transformer 122 to a diode 123 to be detected. The detected signal from the diode 123 is delivered to a terminal 124. The detected signal from the diode 123 is also applied to a time constant circuit 125 to be an AGC voltage which is applied to the base electrode of the transistor 107.

Figure 5:
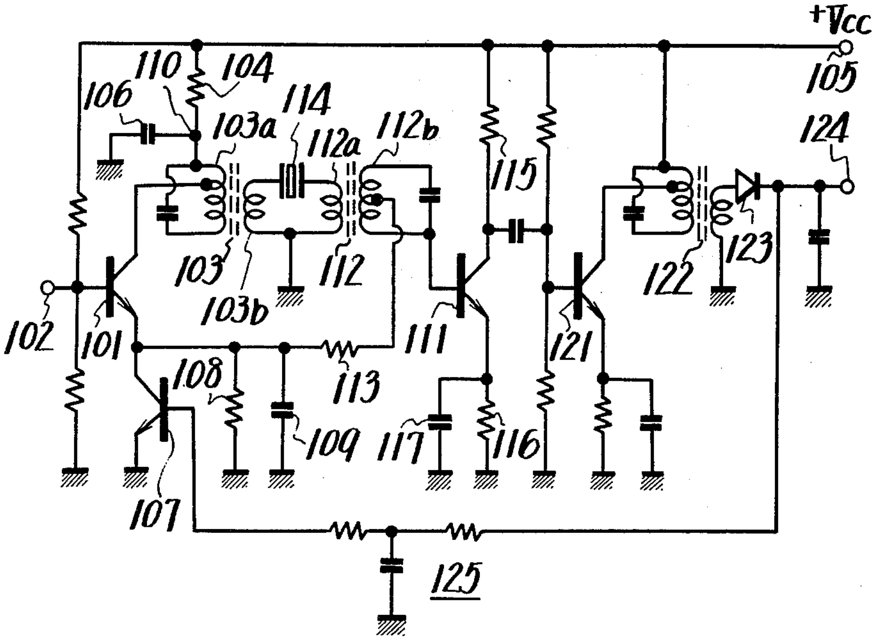
FIG. 5 is a connection diagram showing a third embodiment of the AGC circuit according to this invention.

With the circuit shown in FIG. 5, when the input level at the terminal 102 increases, the level of the detected signal from the diode 123 is intended to be increased. At this time, however, the level of the AGC voltage from the time constant circuit 125 also increases, so that the impedance of the transistor 107 is reduced. Thus, the collector current of the transistor 101 increases and consequently the voltage drop across the resistor 104 increases. As a result, the voltage across the collector-emitter of the transistor 101 decreases and its gain is made low. That is, a forward AGC is applied in the transistor 101.

Since the base bias for the transistor 111 is obtained from the emitter electrode of the transistor 107, when the input level at the terminal 102 increases and the impedance of the transistor 107 is reduced, the base bias of the transistor 111 is reduced and its collector current decreases. As a result, the gain of the transistor 11 is reduced. That is, a reverse AGC is applied in the transistor 111.

Accordingly, if the operating point of the transistor 111 is previously determined and the reverse AGC applied thereto is made as a delay type AGC, when the input level at the terminal 102 is low, the forward AGC is applied in the transistor 101, while as the input level at the terminal 102 becomes high further, the reverse AGC is applied in the transistor 111 in addition to the forward AGC in the transistor 101. Thus, the detected signal constant in level can be obtained at the terminal 124 irrespective of the input level.

With the embodiment of the invention shown in FIG. 5, the forward AGC wide in a control range and the reverse AGC in the delay type are combined, so that the control range of the AGC is widened further as a whole. Further, since both the forward AGC and reverse AGC are controlled by the common transistor 107, the circuit shown in FIG. 5 is reduced in number of the parts and simple in construction.

Figure 6:
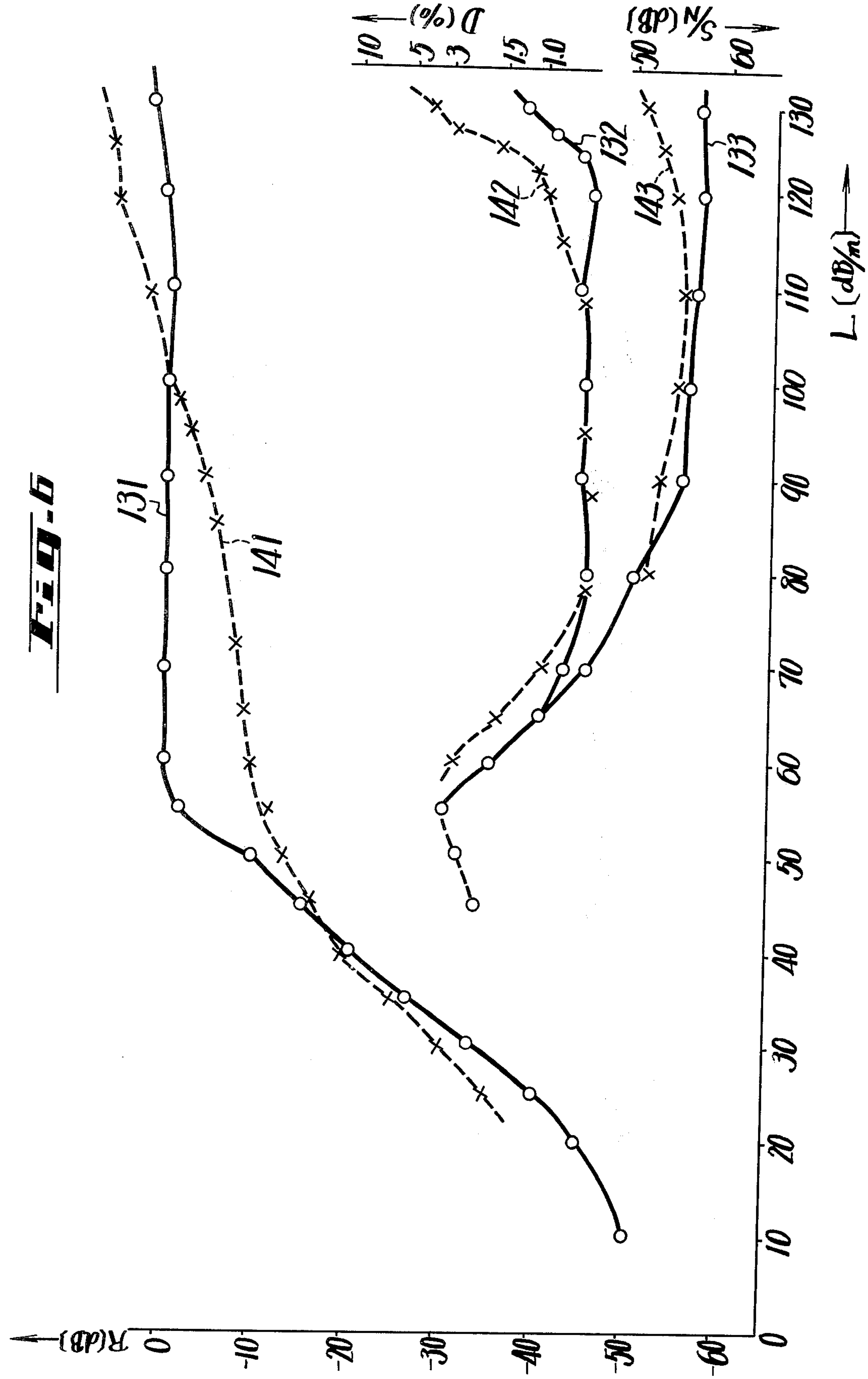
FIG. 6 is a graph showing characteristics of the embodiment of the AGC circuit shown in FIG. 5 which are obtained by actual measurements.

FIG. 6 is a graph showing characteristics of the AGC circuit according to the invention shown in FIG. 5 and that of the prior art obtained by measurements, in which the abscissa represents the input level L in dB/m, the first or left ordinate the response R in dB, and the second or right ordinate the distortion ratio D in % and S/N ratio in dB, respectively.

In the graph of FIG. 6, curves 131 to 133 indicate the characteristics of the AGC circuit of the invention shown in FIG. 5, and curves 141 to 143 indicate those of the prior art AGC circuit. Especially, the curves 131 and 141 are input characteristics, the curves 132 and 142 the distortion characteristics, and the curves 133 and 143 S/N characteristics, respectively.

As may be apparent from the graph of FIG. 6, with the AGC circuit of the invention shown in FIG. 5, since the control range of the AGC is wide, the distortion is very small and superior in S/N ratio, even if the input signal is high in level.

It may be apparent that many modifications and variations could be effected by those skilled in the art without departing from the spirits and scope of the novel concepts of the invention.

We claim as our invention:

1. In an AGC circuit in which an emitter electrode of a transistor for amplification is grounded through a collector-emitter path of a transistor for control, the collector electrode of the first mentioned transistor is connected to a voltage source through a series connection of a tuning circuit and a resistor, and the connection point between the tuning circuit and resistor is grounded through a capacitor and a detected signal is applied to a low-pass filter, said AGC circuit comprising:

a. a series connection of a resistor and a capacitor connected between said connection point and the base electrode of said second mentioned transistor, an AGC voltage produced by said low-pass filter being applied to the base electrode of said second mentioned transistor.

2. An AGC circuit according to claim 1 further comprising a series connection of a diode and a capacitor connected in parallel to said low-pass filter.

3. An AGC circuit according to claim 2, in which a connection point between said diode and capacitor is grounded through a resistor.

* * * * *